US006998887B2

(12) United States Patent
Gauthier et al.

(10) Patent No.: US 6,998,887 B2
(45) Date of Patent: *Feb. 14, 2006

(54) CALIBRATION TECHNIQUE FOR PHASE LOCKED LOOP LEAKAGE CURRENT

(75) Inventors: Claude R. Gauthier, Fremont, CA (US); Brian W. Amick, Austin, TX (US); Pradeep Trivedi, Sunnyvale, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 498 days.

This patent is subject to a terminal disclaimer.

(21) Appl. No.: 10/222,648

(22) Filed: Aug. 16, 2002

(65) Prior Publication Data

US 2004/0033793 A1    Feb. 19, 2004

(51) Int. Cl.
H03L 7/06    (2006.01)
(52) U.S. Cl. ..................................... 327/156; 327/157
(58) Field of Classification Search ........ 327/156–159, 327/362; 375/376
See application file for complete search history.

(56) References Cited

U.S. PATENT DOCUMENTS 4,806,879 A    2/1989  Troxel ........................... 331/2
5,382,992 A    1/1995  Kawamura et al. ........... 354/21
6,570,423 B1*  5/2003  Trivedi et al. ............... 327/157
6,573,770 B1*  6/2003  Gauthier et al. ............. 327/156
6,614,287 B1*  9/2003  Gauthier et al. ............. 327/362

FOREIGN PATENT DOCUMENTS

WO    WO 98/53554    11/1998

OTHER PUBLICATIONS

International Search Report for PCT/US03/24093, mailed Jan. 7, 2004 (3 pages).

* cited by examiner

Primary Examiner—Dinh T. Le
(74) Attorney, Agent, or Firm—Osha Liang LLP

(57) ABSTRACT

A method and apparatus for post-fabrication calibration and adjustment of a phase locked loop leakage current is provided. The calibration and adjustment system includes an adjustment circuit that adjusts a leakage current offset circuit to compensate for the leakage current of a capacitor. The capacitor connects to a control voltage of the phase locked loop. Such control of the leakage current in the phase locked loop allows a designer to achieve a desired phase locked loop operating characteristic after the phase locked loop has been fabricated. A representative value of the amount of compensation desired in the leakage current may be stored and subsequently read to adjust the phase locked loop.

23 Claims, 10 Drawing Sheets

CALIBRATION TECHNIQUE FOR PHASE LOCKED LOOP LEAKAGE CURRENT

BACKGROUND OF INVENTION

As shown in FIG. 1, a typical computer system (10) has, among other components, a microprocessor (12), one or more forms of memory (14), integrated circuits (16) having specific functionalities, and peripheral computer resources (not shown), e.g., monitor, keyboard, software programs, etc. These components communicate with one another via communication paths (19), e.g., wires, buses, etc., to accomplish the various tasks of the computer system (10).

In order to properly accomplish such tasks, the computer system (10) relies on the basis of time to coordinate its various operations. To that end, a crystal oscillator (18) generates a system clock signal (referred to and known in the art as "reference clock" and shown in FIG. 1 as SYS_CLK) to various parts of the computer system (10). Modern microprocessors and other integrated circuits, however, are typically capable of operating at frequencies significantly higher than the system clock signal, and thus, it becomes important to ensure that operations involving the microprocessor (12) and the other components of the computer system (10) use a proper and accurate reference of time.

One component used within the computer system (10) to ensure a proper reference of time among the system clock signal and a microprocessor clock signal, i.e., "chip clock signal" or CHIP_CLK, is a type of clock generator known as a phase locked loop (PLL) (20). The PLL (20) is an electronic circuit that controls an oscillator such that the oscillator maintains a constant phase relative to the system clock signal. Referring to FIG. 1, the PLL (20) has as its input the system clock signal, which is its reference signal, and outputs a chip clock signal (shown in FIG. 1 as CHIP_CLK) to the microprocessor (12). The system clock signal and chip clock signal have a specific phase and frequency relationship controlled by the PLL (20). This relationship between the phases and frequencies of the system clock signal and chip clock signal ensures that the various components within the microprocessor (12) use a controlled and accounted for reference of time. When this relationship is not maintained by the PLL (20), however, the operations within the computer system (10) become non-deterministic.

FIG. 2 shows a block diagram of a typical PLL (200). The PLL (200) includes a PLL core (250), buffers (212, 214, 216, 218), and a feedback loop signal (221) on a feedback loop path. The buffers (212, 214) increase the drive strength of an output clock signal (215) to supply other circuits of the microprocessor (12 in FIG. 1) with a chip clock signal (217). The buffers (216, 218) buffer the chip clock signal (217) to additional circuits of the microprocessor (12 in FIG. 1). The time delay created by the buffers (212, 214, 216, 218) is accounted for in the feedback signal (221) that is supplied to the PLL core (250).

The PLL core (250) is designed to output the chip clock signal (217), which is a multiple of the system clock signal (201). When the PLL is in "lock," the chip clock signal (217) and system clock signal (201) maintain a specific phase relationship. To allow different multiplication ratios, the PLL core (250) may use several "divide by" circuits. A "divide by" circuit reduces the frequency of the input to the "divide by" circuit at its output by a specified factor. For example, the PLL core (250) uses a divide by A circuit (220) with the system clock signal (201), a divide by C circuit (222) with a voltage-controlled oscillator (210) output signal (213), and a divide by B circuit (224) with the feedback loop signal (221).

A phase-frequency detector (202) aligns the transition edge and frequency of a clock A signal (221) and a clock B signal (223). The phase-frequency detector (202) adjusts its output frequency in order to zero any phase and frequency difference between the clock A signal (221) and the clock B signal (223). The phase-frequency detector (202) produces signals that control charge pumps (204, 234). The phase-frequency detector (202) controls the charge pumps (204, 234) to increase or decrease their output using control signals up, U (203), and down, D (205). The charge pump (204) adds or removes charge from a capacitor $C_1$ (206) that changes the voltage potential at the input of a bias-generator (208). The capacitor (206) is connected between a power supply $V_{DD}$ and a control voltage $V_{CTRL}$ (207). The charge pump (234) adds or removes charge from a bias voltage $V_{BP}$ (209) of a bias-generator (208).

The bias-generator (208) produces bias voltages $V_{BP}$ (209) and $V_{BN}$ (211) in response to the control voltage (207). The PLL core (250) may be self-biased by adding the charge pump (234) to the bias-generator (208) bias voltage $V_{BP}$ (209). The addition of a second charge pump (234) allows the removal of a resistor in series with the capacitor (206). A voltage-controlled oscillator (210) produces an output signal (213) that has a frequency related to the bias voltages $V_{BP}$ (209) and $V_{BN}$ (211).

The "divide by" circuits (220, 222, 224) determine the frequency multiplication factor provided by the PLL core (250). The addition of "divide by" circuits (220, 222, 224) enables the PLL core (250) to multiply the system clock signal (201). Multiplying the system clock signal (201) is useful when the chip clock signal (217) must have a higher frequency than the system clock signal (201).

For example, during normal operation, the variables A and C may both be set to one in the divide by A circuit (220) and divide by C circuit (222), respectively. The variable B may be set to 10 in the divide by B circuit (224). The phase-frequency detector (202) aligns the transition edge and frequency of the clock A signal (221) and the clock B signal (223). The phase-frequency detector (202) adjusts PLL core (250) output clock signal (215) frequency in order to zero any phase and frequency difference between the clock A signal (221) and the clock B signal (223). Because the clock B signal (223) has a divide by B circuit (224) that reduces its input frequency by 10, the phase-frequency detector (202) adjusts the voltage-controlled oscillator (210) output signal (213) to a frequency 10 times greater than the clock A signal (221). Accordingly, the chip clock signal (217) is 10 times higher in frequency than the system clock signal (201).

The power consumption of a microprocessor is of concern. Reducing the frequency of the chip clock signal (217) reduces the switching rate of other circuits in the microprocessor (12 in FIG. 1). A low power mode may be entered when there is no activity in the microprocessor for an extended period of time. A slower switching rate typically reduces the power consumption of a microprocessor (12 in FIG. 1).

A change in the frequency of the chip clock signal (217) is accomplished by changing the ratio in the divide by circuits (220, 222, 224). For example, during reduced power operation, the variable A may be set to 16 in the divide by A circuit (220); the variable B may be set to 5 in the divide by B circuit (224); and the variable C may be set to 32 in the divide by C circuit (222). In this example, the frequency of the chip clock signal (217) is 5/16 times the system clock signal (201). Also, the phase-frequency detector (202) updates 16 times less frequently compared to the non-reduced power example above.

Proper operation of the microprocessor (12 shown in FIG. 1) depends on the PLL (200) maintaining a constant phase and frequency relationship between the system clock signal (201) and the chip clock signal (217).

SUMMARY OF INVENTION

According to one aspect of the present invention, an integrated circuit comprises a clock path arranged to carry a clock signal; a power supply path arranged to receive power from a power supply; a phase locked loop operatively connected to the power supply path and the clock path comprises a phase-frequency detector that detects a phase and frequency difference between the clock signal and an oscillator signal, a charge pump, responsive to the phase-frequency detector, that outputs a current on a control signal path, a capacitor, responsive to the current, for storing a voltage potential, and an oscillator, operatively connected to the capacitor, that generates the oscillator signal; a storage device arranged to store control information; and a leakage current offset circuit operatively connected to the capacitor and the storage device where the leakage current offset circuit adjusts the voltage potential dependent on the control information.

According to one aspect of the present invention, a method for post-fabrication treatment of a phase locked loop comprises generating an oscillator signal; comparing the oscillator signal to an input clock signal; generating a current dependent on the comparing; storing a voltage potential on a capacitor dependent on the current; selectively adjusting a leakage current of the capacitor using a leakage current offset circuit responsive to an adjustment circuit; and storing control information determined from the selectively adjusting.

According to one aspect of the present invention, an integrated circuit comprises means for generating an oscillator signal; means for comparing the oscillator signal and a clock signal; means for generating a current dependent on the means for comparing; means for storing a voltage potential on a capacitor dependent on the means for generating the current; means for selectively adjusting a leakage current of the capacitor; and means for storing control information dependent on the means for selectively adjusting.

Other aspects and advantages of the invention will be apparent from the following description and the appended claims.

DETAILED DESCRIPTION

Figure 1:
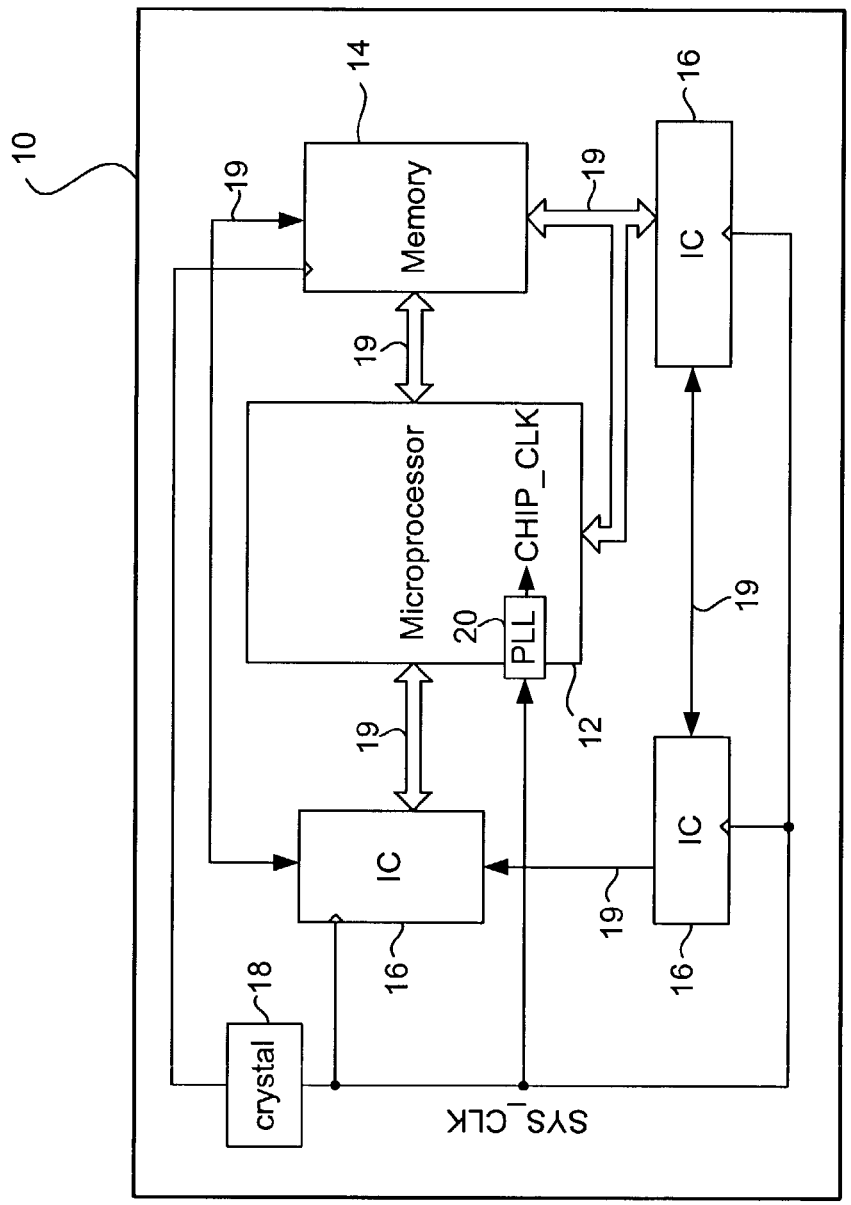
FIG. 1 shows a typical computer system component.

Exemplary embodiments of the invention will be described with reference to the accompanying drawings. Like items in the drawings are shown with the same reference numbers.

Figure 2:
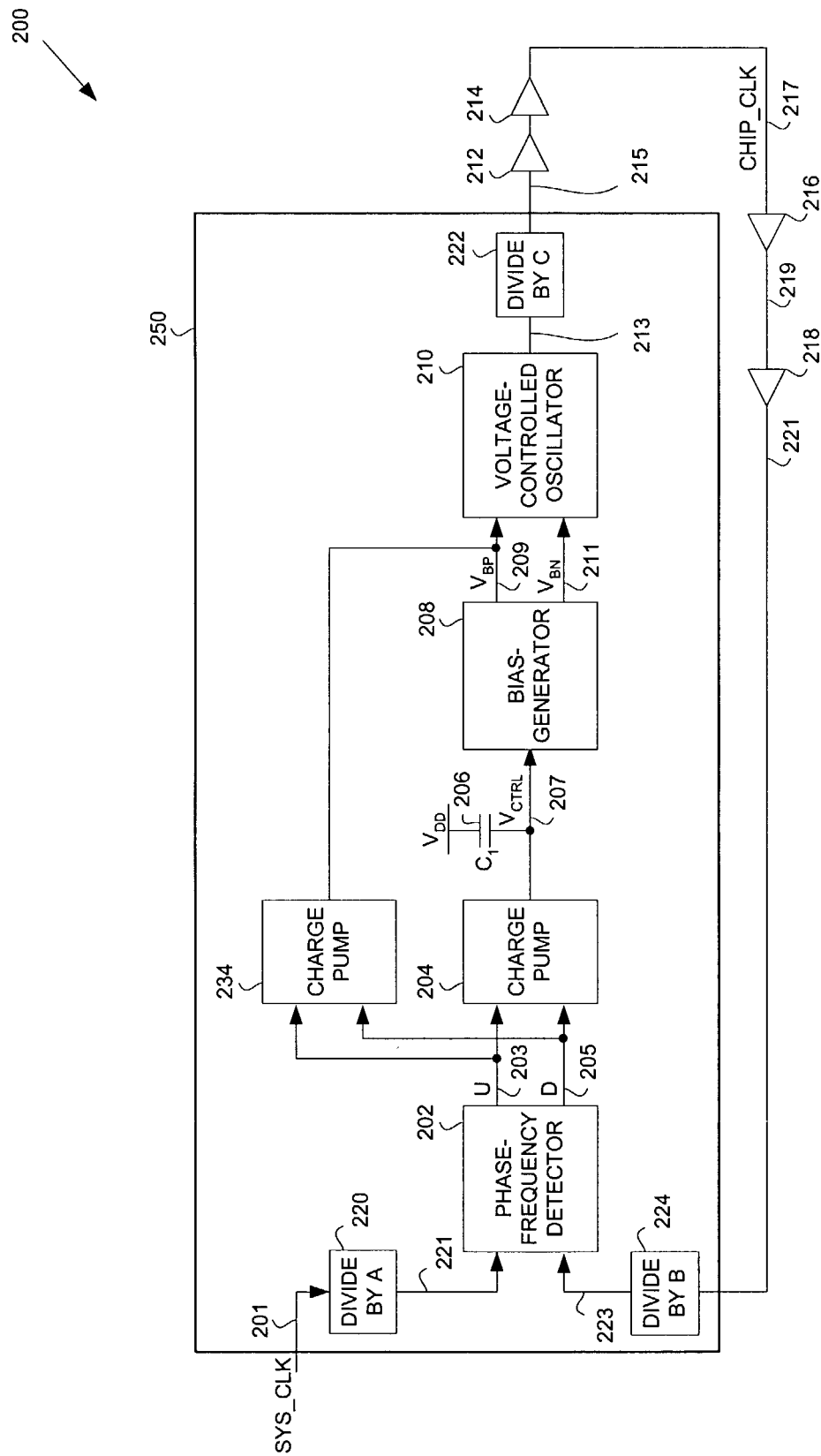
FIG. 2 shows a block diagram of a prior art phase locked loop.

The present invention relates to an adjustment and calibration system for post-fabrication adjustment of a PLL (200 shown in FIG. 2). In FIG. 2, the PLL (200) determines the phase and frequency relationship between the system clock signal (201) and the chip clock signal (217) based on a voltage potential maintained by the capacitor (206). Charge may leak from the capacitor (206), which, in turn, changes the stored voltage potential on the capacitor (206). Accordingly, the frequency of the voltage-controlled oscillator (210) may drift. The adjustment and calibration system includes an adjustment circuit that can compensate for such a leakage current. Thus, the leakage current of the capacitor (206) may be offset so that the capacitor (206) maintains a constant voltage potential. The amount of leakage current offset is stored so that the post-fabrication adjustment of the PLL (200 shown in FIG. 2) is maintained after calibration.

Figure 3:
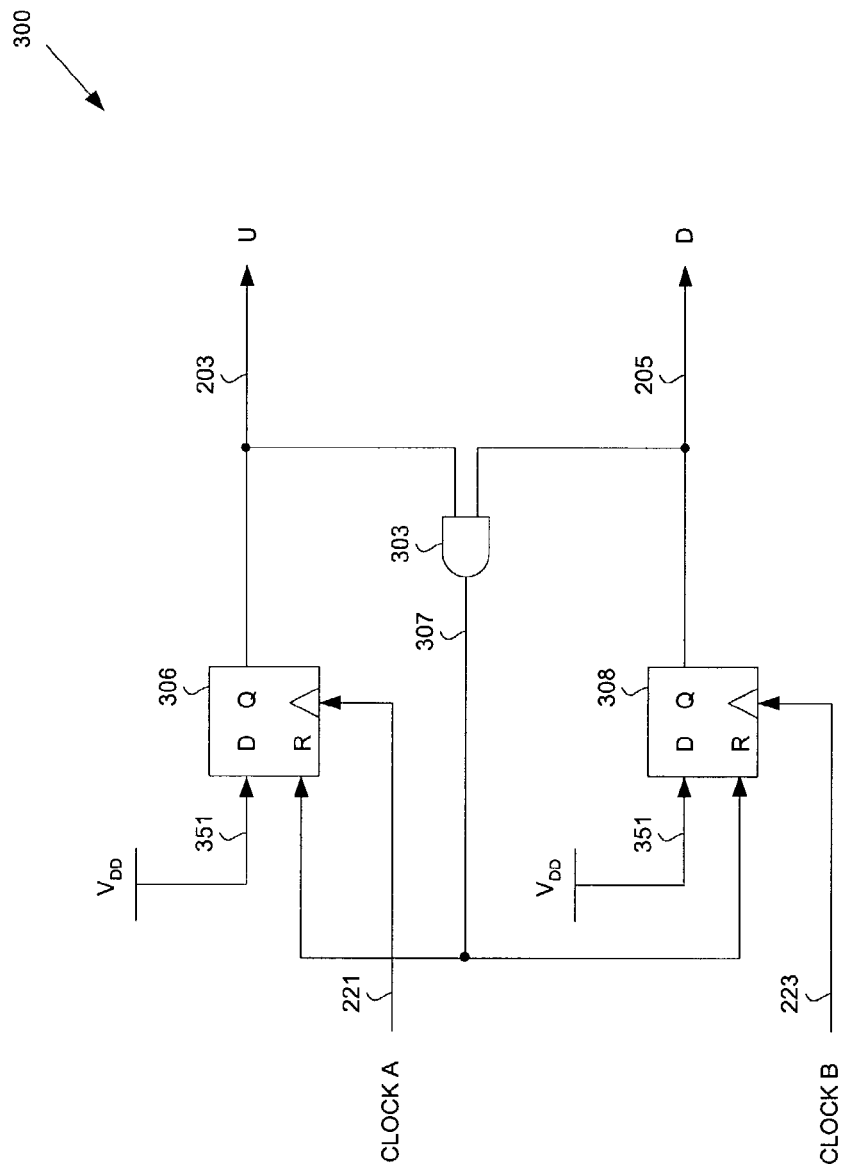
FIG. 3 shows a schematic diagram of a prior art phase-frequency detector.

FIG. 3 shows a block diagram of a typical phase-frequency detector (300). The phase-frequency detector (300) is representative of the phase-frequency detector (202) shown in FIG. 2. The phase-frequency detector (300) integrates the phase error that results between the clock A signal (221) and the clock B signal (223). The clock A signal (221) clocks a flip-flop (306) and the clock B signal (223) clocks a flip-flop (308).

When clock A signal (221) transitions from a low state to a high state, flip-flop (306) transfers the high state created by the power supply $V_{DD}$ (351) on an input of the flip-flop (306) to the up signal (203). When the clock B signal (223) transitions from a low state to a high state, flip-flop (308) transfers the high state created by the power supply $V_{DD}$ (351) on an input of the flip-flop (308) to the down signal (205). When both the up and down signals (203, 205) are at a high state, the AND gate (303) outputs a high state on signal line (307). The high state on signal line (307) resets both flip-flop (306) and flip-flop (308). The up and down signals (203, 205) transition to a low state when the flip-flop (306) and flip-flop (308) are reset, respectively.

Figure 4:
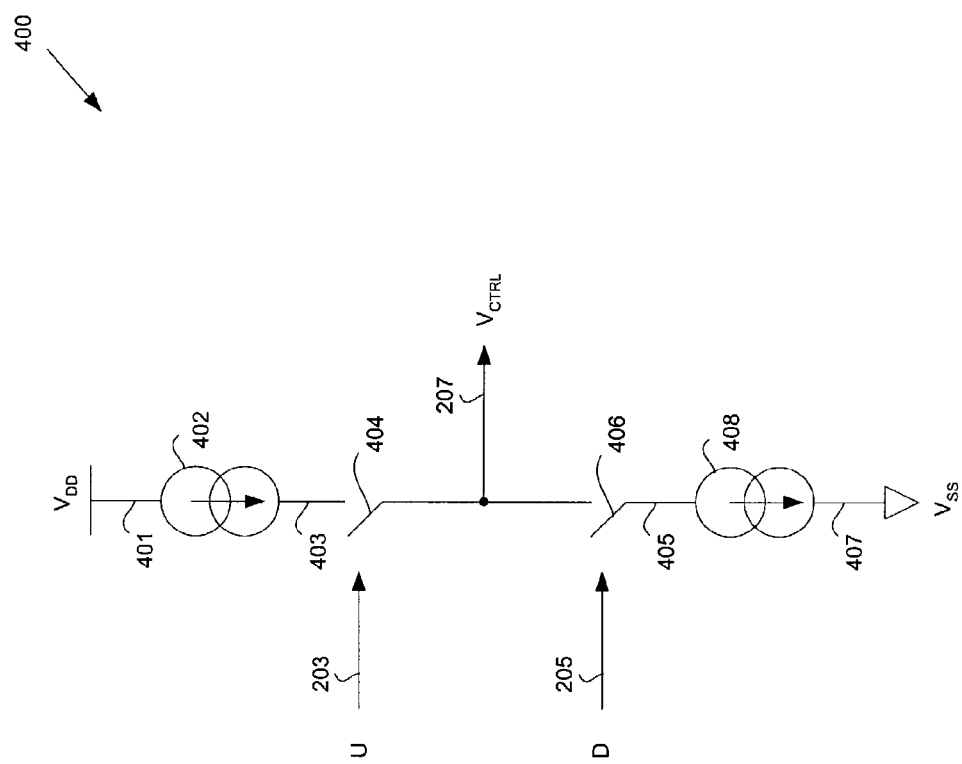
FIG. 4 shows a schematic diagram of a prior art charge pump.

FIG. 4 shows a block diagram of a typical charge pump (400). The charge pump (400) is representative of the charge pumps (204, 234) shown in FIG. 2. The charge pump (400) has two current sources (402, 408). The current source (402) is connected between the power supply $V_{DD}$ (401) and the signal line (403). The current source (408) is connected between the power supply $V_{SS}$ (407) and the signal line (405).

In FIG. 4, the up and down signals (203, 205) from the phase-frequency detector (300) shown in FIG. 3 determine whether switches (404, 406) are closed, respectively. When the up signal (203) is at a high state, the switch (404) is closed. The switch (404) is connected between signal (403) and the control voltage (207). When closed, the switch (404)

allows the current generated by the current source (402) to add charge to the capacitor (206 shown in FIG. 2) using the control voltage (207).

When the down signal (205) is at a high state, the switch (406) is closed. The switch (406) is connected between signal (405) and the control voltage (207). When closed, the switch (406) allows the current generated by the current source (408) to remove charge from the capacitor (206 shown in FIG. 2) using the control voltage (207).

A short time period exists when both the up and down signals (203, 205) are at a high state. In FIG. 3, when both the up and down signals (203, 205) transition to a high state, the AND gate (303) resets the flip-flops (306, 308) by generating a high state on the signal line (307). A finite time duration is needed for the AND gate (303) and the flip-flops (306, 308) to respond to this change in state. In FIG. 4, both the switches (404, 406) are closed when both the up and down signals (203, 205) signals are high. During this time, a nominal amount of charge is added to the capacitor (206 shown in FIG. 2). Some or all of the current generated by the current source (402) is transferred to the $V_{SS}$ power supply (407) through the current source (408).

Figure 5:
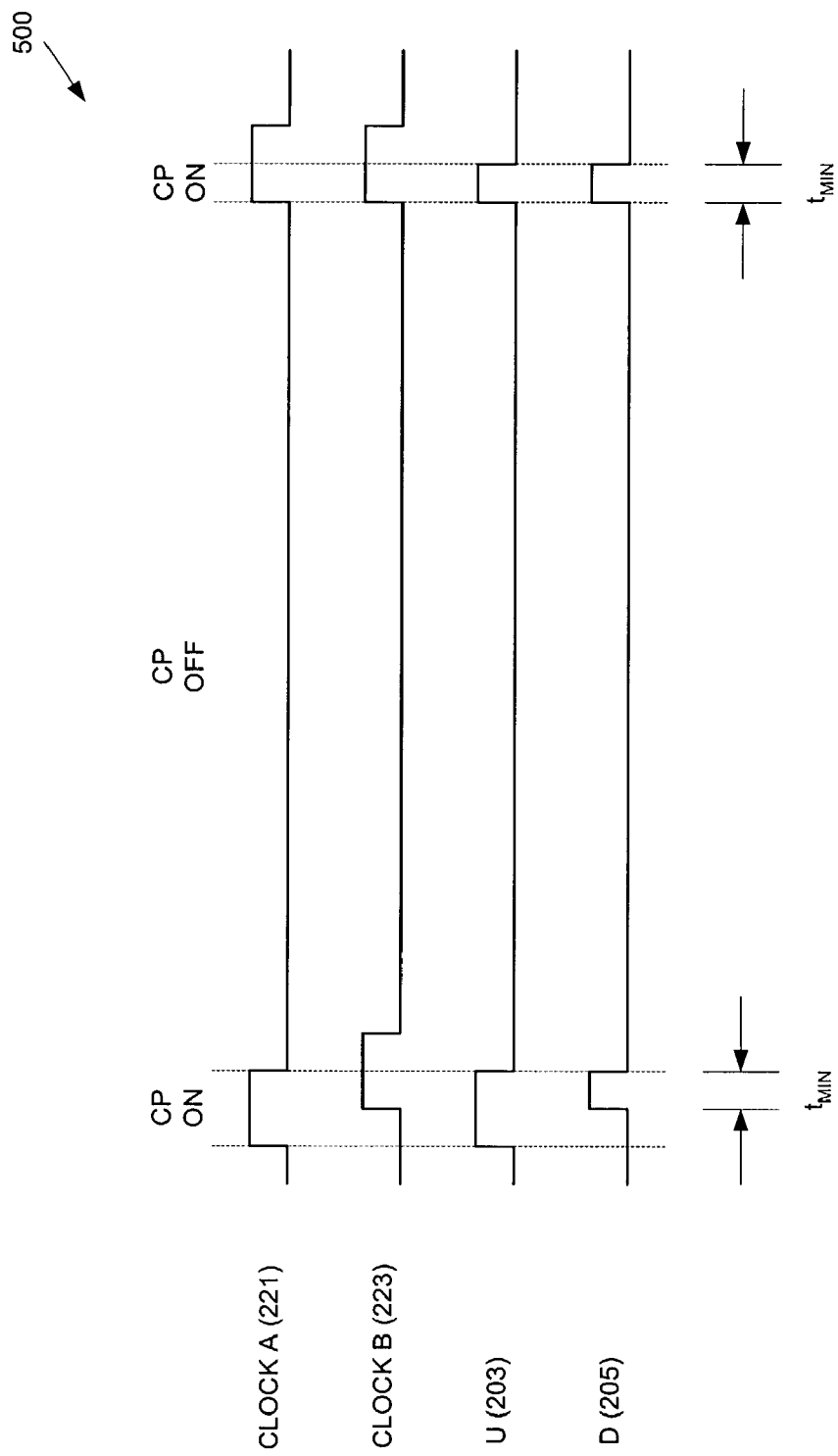
FIG. 5 shows a timing diagram for the phase-frequency detector shown in FIG. 3.

FIG. 5 shows a timing diagram (500) for the phase-frequency detector (300) shown in FIG. 3. The timing diagram (500) shows two clock cycles. The first clock cycle shows the clock B signal (223) lagging the clock A signal (221) (i.e., they are out of phase). The second cycle shows the clock B signal (223) properly aligned with the clock A signal (221).

In the first cycle, when the clock A signal (221) transitions from a low state to a high state, the up signal (203) transitions from a low state to a high state. When the clock B signal (223) transitions from a low state to a high state, the down signal (205) transitions from a low state to a high state. Because both the up and down signals (203, 205) are at a high state, the AND gate (303 shown in FIG. 3) resets both flip-flops (306, 308 shown in FIG. 3). The up and down signals (203, 205) output a low state when the flip-flops (306, 308 shown in FIG. 3) are reset, respectively.

In the first cycle, the up signal (203) is at a high state for a longer duration than the down signal (205). Accordingly, the current source (402 shown in FIG. 4) adds charge to the capacitor (206 shown in FIG. 2). If the down signal (205) was at a high state for a longer duration than the up signal (203), the current source (408 shown in FIG. 4) would remove charge from the capacitor (206 shown in FIG. 2). The change in the voltage potential maintained by the capacitor (206 shown in FIG. 2) affects the frequency of the voltage-controlled oscillator (210 shown in FIG. 2).

In FIG. 5, in the second cycle, both the clock A signal (221) and the clock B signal (223) transition from a low state to a high state at the same time. In other words, the clock A signal (201) and the clock B signal (223) are in phase. Accordingly, both the up and down signals (203, 205) transition from a low state to a high state at the same time. Also, both the flip-flops (306, 308 shown in FIG. 3) are reset simultaneously. Because a finite time duration (i.e., $t_{MIN}$) is needed for the AND gate (303 shown in FIG. 3) and the flip-flops (306, 308 shown in FIG. 3) to respond to the change in state, both the up and down signals (203, 205) have a finite time duration for which they are high. A nominal amount of charge is added to the capacitor (206 shown in FIG. 2) to maintain the present voltage potential on the control voltage (207 shown in FIG. 2).

In FIG. 5, the times during which the charge pump (400 shown in FIG. 4) may modify or maintain the charge on the capacitor (206 shown in FIG. 2) are indicated. When the clock A signal (221) and the clock B signal (223) are aligned, the time duration that the charge pump (400 shown in FIG. 4) is active is relatively small (i.e., $t_{MIN}$). During the time the charge pump (400 shown in FIG. 4) is inactive (i.e., when both switches (404, 406) are open), the voltage potential on the capacitor (206 shown in FIG. 2) may drift due to leakage currents inherent with devices used to form the capacitor (206 shown in FIG. 2). Furthermore, the time duration that the charge pump (400 shown in FIG. 4) is inactive (i.e., when both switches (404, 406) are open) is increased during power reduction modes. As in the example above, the time duration between the charge pump (400 shown in FIG. 4) activity is increased 16 times in a power reduction mode compared to normal operation. The voltage potential on the capacitor (206 in FIG. 2) may drift a larger amount during the power reduction mode. A means to compensate for the drift and store the amount of compensation is needed.

Semiconductor capacitors are typically parallel plate capacitors formed by connecting the source and drain of a transistor together to create one terminal of the capacitor. The other terminal of the capacitor is formed by the gate connection of the transistor. Tunneling through the gate creates a path for leakage current. Leakage current causes the voltage potential originally stored on the capacitor to change. In a PLL, the capacitor (e.g., 206 shown in FIG. 2) helps maintain the amount of frequency produced by the voltage-controlled oscillator (210 shown in FIG. 2).

In FIG. 2, the relatively long time durations between the charge pump (204) updating the charge stored (i.e., voltage potential stored) on the capacitor (206) may result in a drift in the expected amount of frequency of the PLL (200). Although a designer may intend for an integrated circuit to have a particular value for the leakage current of the capacitor (206), actual values for these parameters are typically unknown until the integrated circuit has been fabricated (i.e., in a post-fabrication stage).

For example, a designer may intend for the frequency drift of the PLL (200) to be within in a particular range. The leakage current of the capacitor (206) may be unintentionally affected by many factors in the fabrication process. Because the leakage current cannot be redesigned in the post-fabrication stage without considerable temporal and monetary expenditures, these fabrication factors may cause the PLL (200) to have a different frequency drift range than the range the PLL (200) was designed. Consequently, the PLL (200) may have poor performance. Accordingly, there is a need for a technique and design that facilitates increased post-fabrication control of leakage current in the capacitor (206) of the PLL (200). The amount of leakage current offset is stored so that the post-fabrication adjustment of the PLL (200) is maintained after calibration.

Figure 6:
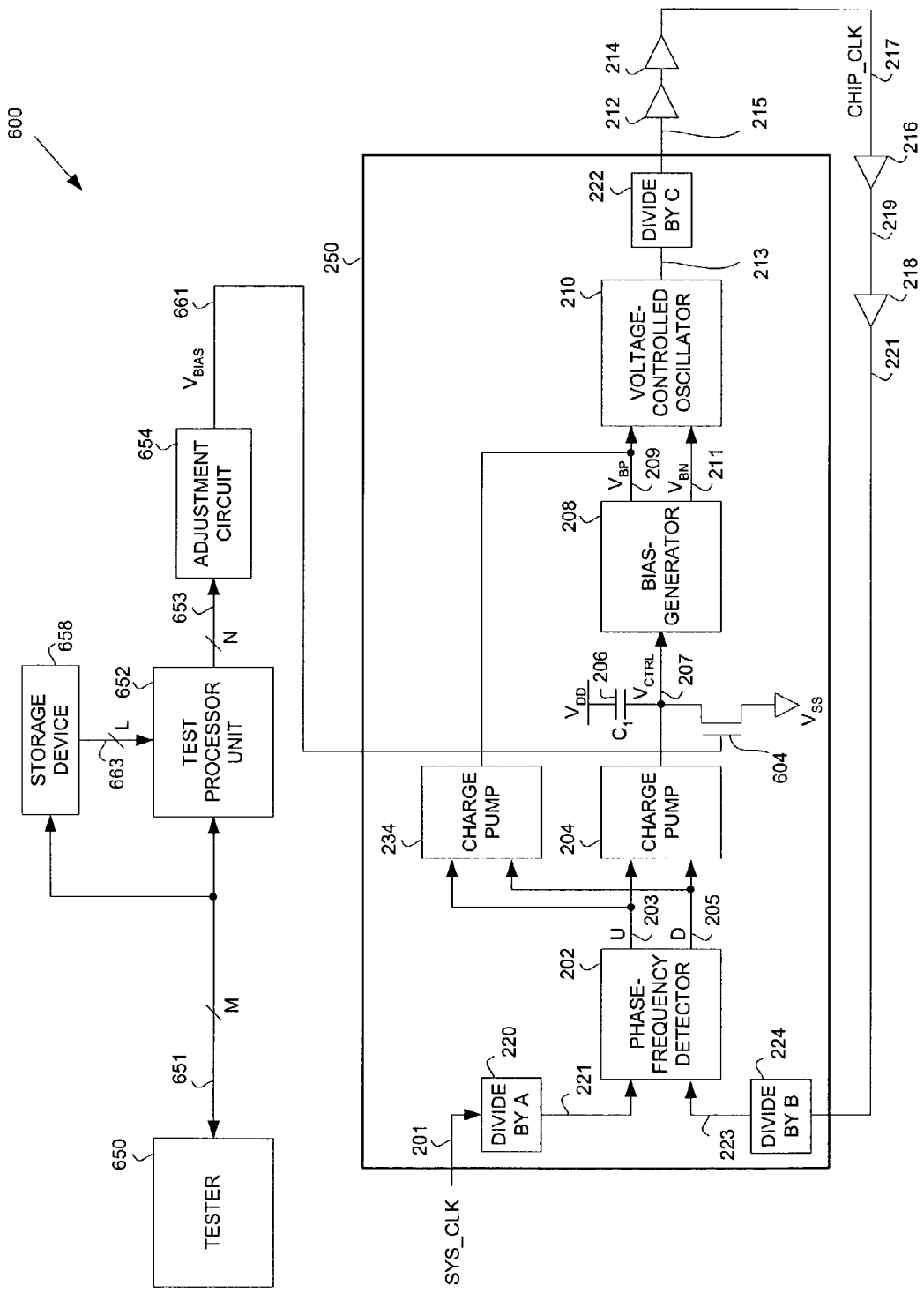
FIG. 6 shows a block diagram of a phase locked loop with an adjustable leakage current offset circuit and a storage device in accordance with an embodiment of the present invention.

FIG. 6 shows an exemplary adjustable PLL (600) in accordance with an embodiment of the present invention. The phase-frequency detector (202), capacitor (206), bias-generator (208), and voltage-controlled oscillator (210) of the adjustable PLL (600) operate similar to those respective components described above with reference to FIG. 2.

In FIG. 6, a leakage current offset circuit (604) is connected between the control voltage (207) and a power supply $V_{SS}$. As the capacitor (206) leaks current, the voltage potential on the control voltage (207) has a tendency to drift toward the power supply $V_{DD}$. The leakage current offset circuit (604) is arranged to pull the voltage potential on the control voltage (207) toward a power supply $V_{SS}$. For example, an n-channel transistor is used as the leakage current offset circuit (604).

One of ordinary skill in the art will appreciate that in other embodiments, the capacitor (206) may be connected between the control voltage (207) and the power supply $V_{SS}$. In this case, the leakage current offset circuit (604) is connected between the control voltage (207) and the power supply $V_{DD}$. A leakage current offset circuit (604) in this arrangement may be a p-channel transistor.

In FIG. 6, an adjustment circuit (654) is used to adjust the leakage current offset circuit (604) to compensate for the leakage current of the capacitor (206). A bias voltage potential, $V_{BIAS}$ (661), is used to control the amount of compensation applied to offset the leakage current. The bias voltage potential (661) may be adjusted to increase, decrease, turn off, or maintain the amount of leakage current compensation (i.e., leakage current offset) produced by the leakage current offset circuit (604).

In FIG. 6, a test processor unit (652) controls the adjustment circuit (654) using multiple adjustment signals N (653). The values of the multiple adjustment signals N (653) are determined by the test processor unit (652). The test processor unit (652) may communicate through a host interface (not shown) using M communication lines (651). Those with ordinary skill in the art will appreciate that the host interface and M communication lines (651) may take a wide variety of forms. The communication may be defined by an industry standard.

The host interface (not shown) may be used to operatively connect to a separate computer system. For example, a tester (650) may communicate with the test processor unit (652). In some embodiments, the tester (650) may instruct the test processor unit (652) to adjust adjustment circuit (654) to modify a leakage current offset of the adjustable PLL (600). In some embodiments, the tester (650) may measure an operating characteristic of the adjustable PLL (600) or a representative operating characteristic of an integrated circuit on which the adjustable PLL (600) resides to determine the effect of the adjustment. A variety of different adjustments may be made in an effort to identify the adjustment settings that produce the desired operating characteristics of the adjustable PLL (600).

For example, the tester (650) may be used to adjust the adjustable PLL (600) until the frequency drift in the voltage-controlled oscillator (210) is minimized. The tester (650) may also be used to adjust the adjustable PLL (600) until the operating characteristics of the adjustable PLL (600) reaches a desired performance level. The operating characteristics may include frequency drift, maximum operating frequency, minimum operating frequency, lock time, etc.

A storage device (658) may be designed to store control information representative of the adjustment settings that produce the desired operating characteristics of the adjustable PLL (600). By using the tester (650), control information may be written into the storage device (658). The tester (650) may read or rewrite the control information in the storage device (658).

The storage device (658) may include multiple storage elements such that the control information may be represented by a binary word. For example, the control information stored in the storage device (658) may be a binary word that matches the values of the multiple adjustment signals N (653). Alternatively, the control information may be a binary encoded word. For example, if the multiple adjustment signals N (653) used eight adjustment signals, the control information might be represented with a three bit binary word. Alternatively, the control information may contain instructions, interpreted by the test processor unit (652), to control the multiple adjustment signals N (653).

In FIG. 6, the tester (650) may be removed from the adjustable PLL (600). The test processor unit (652) may read the storage device (658) to obtain the control information and determine the amount of adjustment by the adjustment circuit (654). The adjustable PLL (600), after the test processor unit (652) reads the control information in the storage device (658) and adjusts the adjustment circuit (654), may have an operating characteristic similar to the operating characteristics obtained while connected to the tester (650). The test processor unit (652) reads the control information from storage device (658) using the L signal lines (663).

Those skilled in the art will appreciate that the adjustable PLL (600) may be analog, digital, or a combination of both types of circuits.

Figure 7:
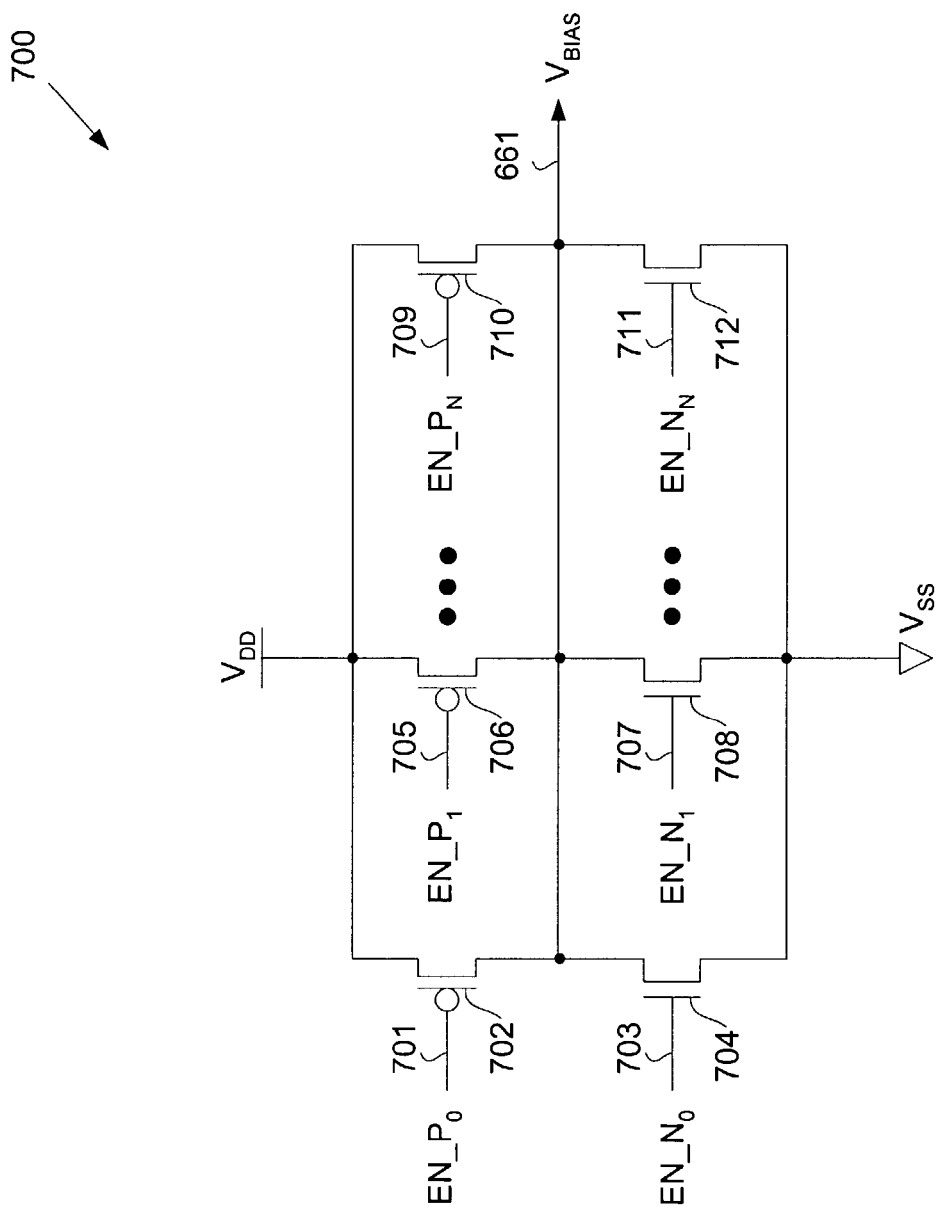
FIG. 7 shows a schematic diagram of an adjustment circuit in accordance with an embodiment of the present invention.

FIG. 7 shows an exemplary adjustment circuit (700) in accordance with an embodiment of the present invention. The adjustment circuit (700) includes multiple p-channel transistors (702, 706, 710) arranged in parallel with each other. The multiple p-channel transistors (702, 706, 710) connect between the power supply $V_{DD}$ and a common node on which a bias voltage potential $V_{BIAS}$ (661) is supplied to the leakage current offset circuit (604 shown in FIG. 6). The adjustment circuit (700) also includes multiple n-channel transistors (704, 708, 712) arranged in parallel with each other. The multiple n-channel transistors (704, 708, 712) connect between power supply $V_{SS}$ and the bias voltage potential (661).

Each transistor has an individual control signal that turns "on" or "off" the respective p-channel transistors (702, 706, 710) and respective n-channel transistors (704, 708, 712). The p-channel transistors (702, 706, 710) have control signals EN_$P_0$ (701), EN_$P_1$ (705), and EN_$P_N$ (709) connected to their gates, respectively. The n-channel transistors (704, 708, 712) have control signals EN_$N_0$ (703), EN_$N_1$ (707), and EN_$N_N$ (711) connected to their gates, respectively. A "low" voltage potential on any of the EN_$P_X$ control signals (701, 705, 709), where "x" represents any index 0 through N, turns "on" the respective p-channel transistor (702, 706, 710). A "high" voltage potential on any of the EN_$N_X$ control signals (703, 707, 711), where "x" represents any index 0 through N, turns "on" the respective n-channel transistor (704, 708, 712).

A p-channel transistor (702, 706, 710) that is "on" changes the bias voltage potential (661) toward power supply $V_{DD}$. An n-channel transistor (704, 708, 712) that is "on" changes the bias voltage potential (661) toward power supply $V_{SS}$. By selecting which p-channel transistors (702, 706, 710) and/or n-channel transistors (704, 708, 712) are "on," a selected change in the bias voltage potential (661) may be achieved.

Those with ordinary skill in the art will appreciate that the p-channel transistors (702, 706, 710) and n-channel transistors (704, 708, 712) may be turned "on" individually or as a group. The p-channel transistors (702, 706, 710) and n-channel transistors (704, 708, 712) may be sized so that each transistor has a different effect compared to the other transistors. For example, a transistor's gate width may be varied to adjust the strength of each transistor. The gate widths of the p-channel transistors (702, 706, 710) and n-channel transistors (704, 708, 712) may be designed to provide a linear, exponential, or other function as more transistors are turned "on." In some embodiments, the p-channel transistors (702, 706, 710) and n-channel transistors (704, 708, 712) may be sized so that each transistor has a different resistance. For example, transistor gate lengths may be increased (i.e., long channel transistors) to increase the inherent resistance of each transistor. A larger inherent resistance may be advantageous if both a p-channel transistor and a n-channel transistor are "on" simultaneously. In one or more embodiments, the adjustment circuit (700) may include only one p-channel transistor (e.g., p-channel transistor (702)) and one n-channel transistor (e.g., n-channel transistor (704)) connected in series.

The adjustment circuit (700) in FIG. 7 may be used as the adjustment circuit (654) shown in FIG. 6. In FIG. 6, the test processor unit (652) generates a binary control word that determines which n-channel transistors (704, 708, 712 shown in FIG. 7) and p-channel transistors (702, 706, 710 shown in FIG. 7) are "on" and which are "off" in the adjustment circuit (654). Depending on the binary control word maintained by the test processor unit (652), multiple adjustment signals N (653) that represent EN_$N_X$ signals (703, 707, 711 in FIG. 7) and EN_$P_X$ signals (701, 705, 709 in FIG. 7) may turn "on" or turn "off" the p-channel transistors (702, 706, 710 shown in FIG. 7) and n-channel transistors (704, 708, 712 shown in FIG. 7) in the adjustment circuit (654). The bias voltage potential (661) of the adjustment circuit (654) adjusts the leakage current offset circuit (604).

Figure 8:
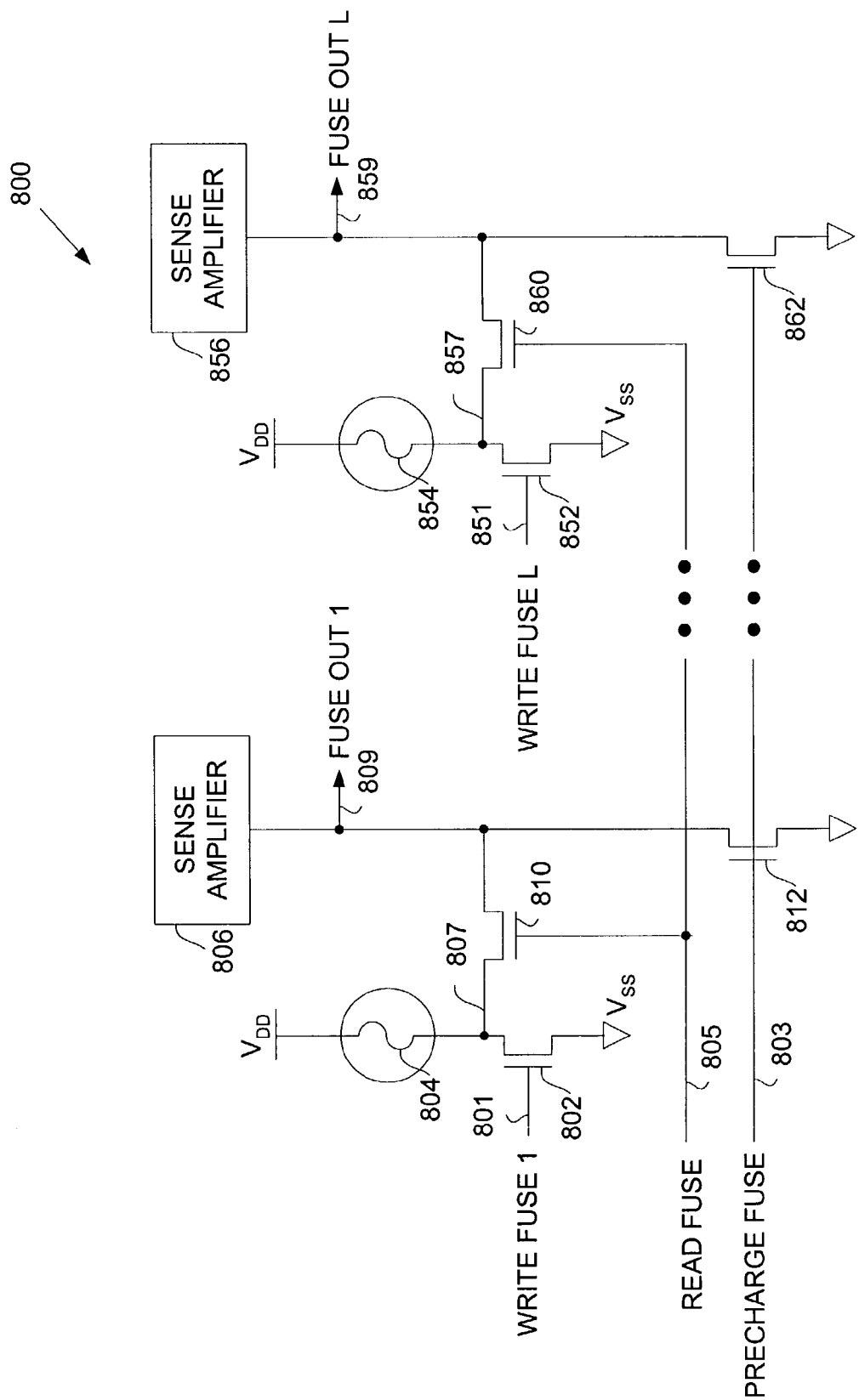
FIG. 8 shows a schematic diagram of a storage device in accordance with an embodiment of the present invention.

FIG. 8 shows an exemplary storage device (800) in accordance with an a embodiment of the present invention. The storage device (800) may be used for the storage device (658 shown in FIG. 6). The storage device (800) includes electrically programmable fuses (804, 854) to store nonvolatile control information.

In FIG. 8, multiple write signals such as write fuse 1 signal (801) through write fuse L signal (851) are used to program electrically programmable fuses (804, 854), respectively. A "high" voltage potential on the write fuse 1 signal (801) and write fuse L signal (851) causes n-channel transistors (802, 852) to turn "on," respectively. If n-channel transistors (802, 852) are "on" for a sufficient duration, the fuse (804) and fuse (854), respectively, create an "open" circuit. A precharge fuse signal (803) will pulse a "high" voltage potential on the gates of n-channel transistors (812, 862) to momentarily turn them "on." If n-channel transistors (812, 862) are "on," fuse out 1 signal (809) and fuse out L signal (859) will be pulled to a "low" voltage potential by n-channel transistors (812, 862). The "low" voltage potential on the fuse out 1 signal (809) and the fuse out L (859) will precharge the fuse out 1 signal (809) and the fuse out L signal (859) in anticipation of a read operation.

In FIG. 8, a "high" voltage potential on a read fuse signal (805) causes n-channel transistors (810, 860) to turn "on." If any of the fuses (804, 854) are intact (i.e., shorted), the fuse out 1 signal (809) and the fuse out L signal (859) are pulled to a "high" voltage potential. If any of the fuses (804, 854) are open, the fuse out 1 signal (809) and the fuse out L signal (859) remain at a "low" voltage potential. Sense amplifiers (806, 856) sense the voltage potential levels on the fuse out 1 signal (809) and the fuse out L signal (859), respectively, to amplify and maintain the voltage potential levels.

Figure 9:
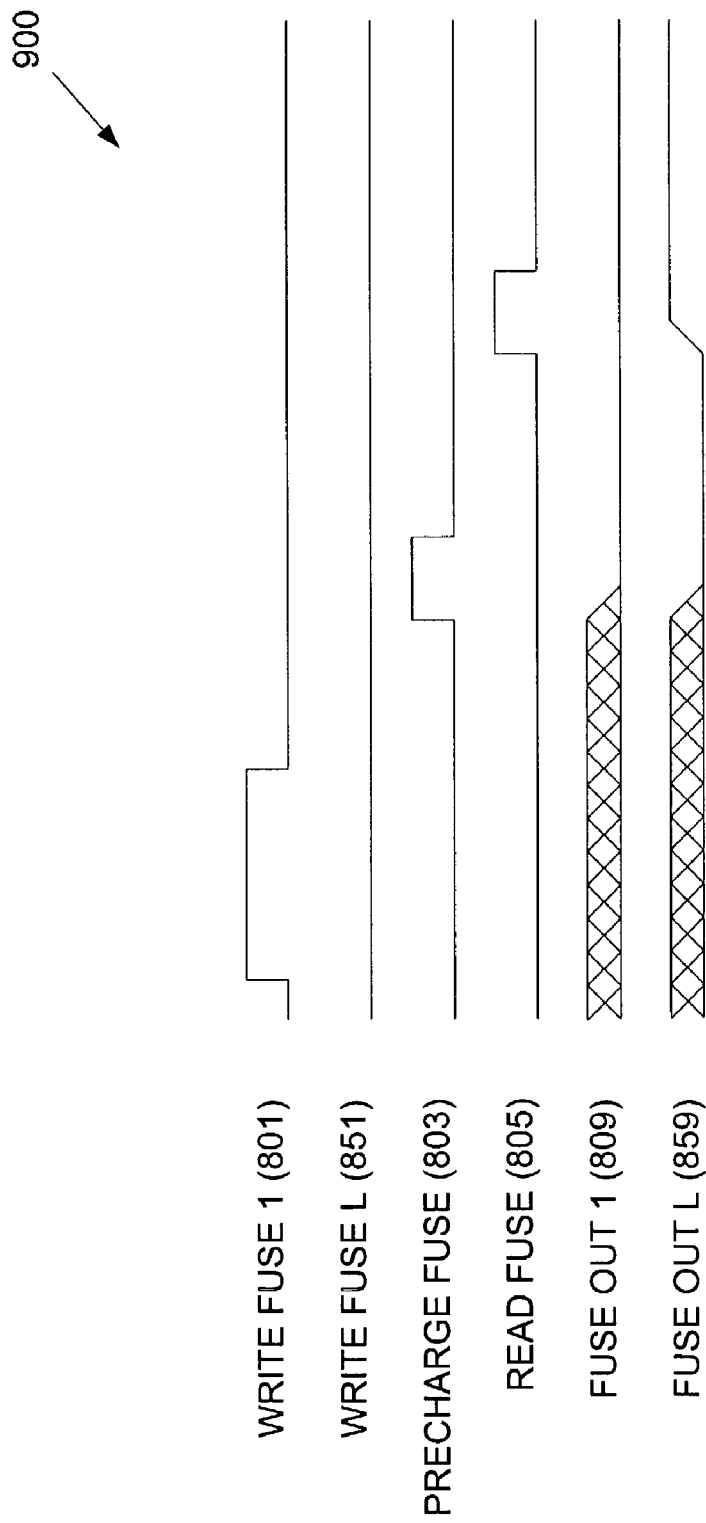
FIG. 9 shows a timing diagram for the storage device shown in FIG. 8.

FIG. 9 shows a timing diagram (900) related to the programming of the storage device (800 shown in FIG. 8) in accordance with an embodiment of the present invention. In this example, the write fuse 1 signal (801) is pulsed to a "high" voltage potential to create an "open" on fuse (804). The write fuse L signal (851) remains at a "low" voltage potential to leave fuse (804) intact. Precharge fuse signal (803) signal pulses a "high" voltage potential to pull the fuse out 1 signal (809) and fuse out L signal (859) to a "low" voltage potential. The read fuse signal (805) pulses a "high" voltage potential to read the state of the fuses (804, 854). Because fuse (804) is "open," the fuse out 1 signal (809) remains at a "low" voltage potential. Because fuse (854) is intact or "shorted," the fuse out L signal (859) is pulled to a "high" voltage potential.

Because the fuses (804, 854) have been programmed and read, the fuse out 1 signal (809) and the fuse out L signal (859) maintain the programmed control information. The state of the fuses (804, 854) may be read at any time by observing the voltage potential level on the fuse out 1 signal (809) and the fuse out L signal (859). Also, the state of the fuses (804, 854) may be read by repeating the precharge and read cycles. Using multiple fuses and related circuitry, a binary word may represent the stored control information.

One of ordinary skill in the art will appreciate that the electrically programmable fuses are but one method to store information. In other embodiments, the storage device (658 in FIG. 6) may contain a wide variety of types of storage elements including, but not limited to, an electrically programmable fuse, an electrically programmable read only memory, an electrically erasable read only memory, a one time programmable memory, a flash memory, a laser programmable fuse, and a laser programmable anti-fuse.

Figure 10:
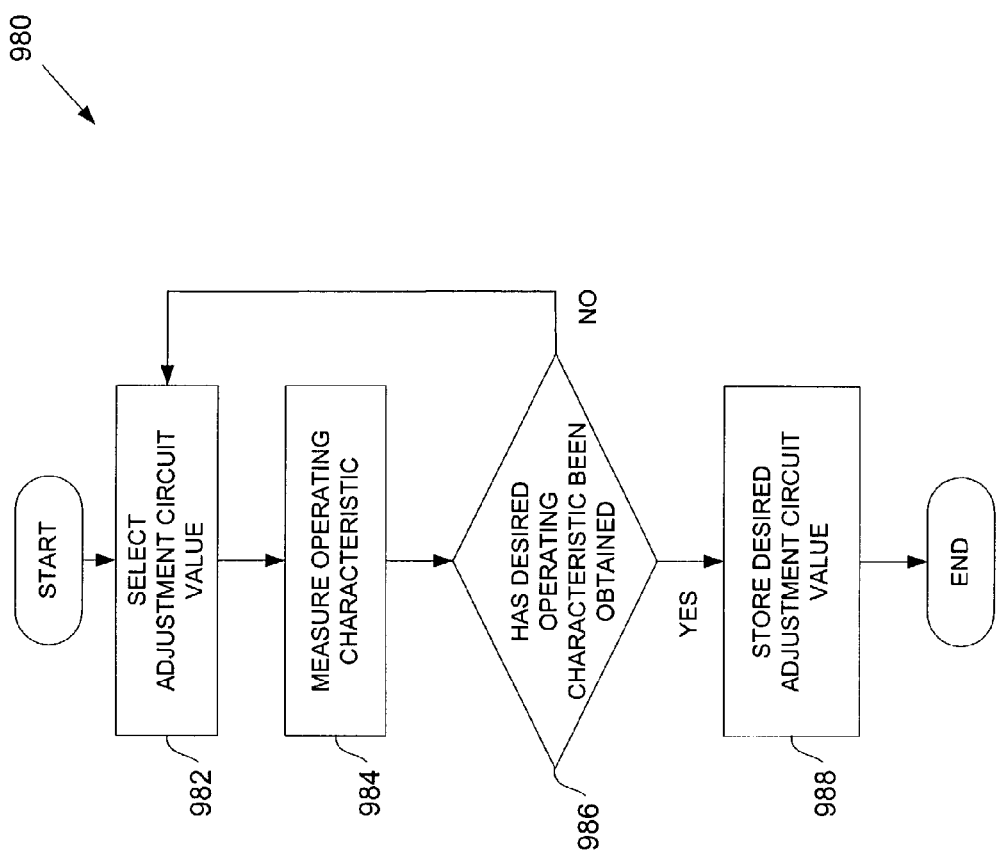
FIG. 10 shows a flow diagram in accordance with an embodiment of the present invention.

FIG. 10 shows a flow diagram in accordance with an embodiment of the present invention. At (982), an adjustment circuit value is selected. The selected adjustment value may be used to adjust adjustment circuit (654 shown in FIG. 6). The adjustment circuit (654 shown in FIG. 6) may create a bias voltage potential (661 shown in FIG. 6) to adjust the leakage current offset circuit (604 shown in FIG. 6). The adjustment of the amount of compensation of the leakage current modifies an operating characteristic of the adjustable PLL (600 in FIG. 6). For example, the oscillator frequency of the adjustable PLL (600 in FIG. 6) may be measured. Also, the performance of other circuits that rely on the adjustable PLL (600 in FIG. 6) may be measured. At (984), the operating characteristics are measured.

At (986) a determination as to whether a desired operating characteristic(s) is obtained. The determination may be based on an operating characteristic(s) taken with the selected adjustment circuit value, or an interpolation or extrapolation from data obtained from selectively adjusting the adjustment circuit value. If the desired operating characteristic(s) has not been obtained, (982) and (984) are repeated until a desired operating characteristic(s) has been obtained. If the desired operating characteristic(s) has been obtained, the adjustment circuit value, or a representation of the value, is stored at (988). The desired adjustment circuit value or representation of the value is stored as control information in the storage device (658 in FIG. 6). The storage device (658 in FIG. 6) may contain control information that may be accessed and used to improve the performance of the adjustable PLL (600 in FIG. 6) after fabrication.

Advantages of the present invention may include one or more of the following. The adjustable PLL (600 in FIG. 6), having been fabricated, may demonstrate operating characteristics that may not have been apparent from simulation. In some embodiments, because the adjustment circuit (654 shown in FIG. 6) may modify the operating characteristics of the adjustable PLL (600 in FIG. 6), the adjustable PLL (600 in FIG. 6) may be calibrated.

In some embodiments, because the adjustable PLL (600 in FIG. 6) may be fabricated with a means for compensating the leakage current of the capacitor (206), fewer design iterations and higher confidence in the adjustable PLL (600 in FIG. 6) operating characteristics may be afforded.

In some embodiments, the tester (650 shown in FIG. 6) and test processor unit (652 shown in FIG. 6) may communicate so that the state of the adjustable PLL (600 in FIG. 6) may be obtained, performance characteristics analyzed, and/or adjustments made to the adjustable PLL (600 shown in FIG. 6). By using the tester (650 shown in FIG. 6), control information may be stored in a storage device (658 shown in FIG. 6).

In some embodiments, the tester (650 shown in FIG. 6) may take a relatively long time to determine the desired value and program the control information. Because the control information is programmed, the adjustable PLL (600 in FIG. 6) and the integrated circuit on which it resides may quickly (for example, within a few nanoseconds) adjust the adjustable PLL (600 in FIG. 6) to obtain proper operation.

In some embodiments, a limited number of adjustable PLLs (600 in FIG. 6) may need to be tested to determine the desired value for the control information for a larger number of adjustable PLLs (600 in FIG. 6).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
    a clock path arranged to carry a clock signal;
    a power supply path arranged to receive power from a power supply;
    a phase locked loop operatively connected to the power supply path and the clock path, comprising:
        a phase-frequency detector arranged to detect a phase and frequency difference between the clock signal and an output clock signal,
        a charge pump, responsive to the phase-frequency detector, arranged to output a current on a control signal path,
        a capacitor, responsive to the current, arranged to store a voltage potential, and
        an oscillator, operatively connected to the capacitor, arranged to generate the output clock signal;
    a storage device arranged to store control information; and
    a leakage current offset circuit operatively connected to the capacitor and the storage device, wherein the leakage current offset circuit arranged to adjust the voltage potential dependent on the control information.

2. The integrated circuit of claim 1, further comprising:
    an adjustment circuit comprising:
        a first switch that controls current flow between a first voltage potential and an output of the adjustment circuit; and
        a second switch that controls current flow between a second voltage potential and the output of the adjustment circuit, wherein the output is operatively connected to the leakage current offset circuit.

3. The integrated circuit of claim 2, wherein the leakage current offset circuit comprises a transistor, and wherein the adjustment circuit is operatively connected to a gate of the transistor.

4. The integrated circuit of claim 2, wherein the first switch comprises a first p-channel transistor and the second switch comprises a first n-channel transistor connected in series.

5. The integrated circuit of claim 4, the adjustment circuit further comprising:
    a second p-channel transistor connected in parallel with the first p-channel transistor; and
    a second n-channel transistor connected in parallel with the first n-channel transistor, wherein the first p-channel transistor and second p-channel transistor are in series with the first n-channel transistor and second n-channel transistor.

6. The integrated circuit of claim 2, further comprising:
    a test processor unit operatively connected to the storage device and the adjustment circuit.

7. The integrated circuit of claim 6, further comprising:
    a tester arranged to communicate with the test processor unit and read at least a portion of the control information in the storage device.

8. The integrated circuit of claim 6, further comprising:
    a tester arranged to communicate with the test processor unit and write at least a portion of the control information in the storage device.

9. The integrated circuit of claim 1, wherein the storage device comprises a storage element selected from a group consisting of an electrically programmed fuse, an electrically programmed read only memory, an electrically erasable read only memory, a one time programmable memory, and a flash memory.

10. The integrated circuit of claim 1, wherein the storage device comprises a storage element selected from a group consisting of a laser programmable fuse and a laser programmable anti-fuse.

11. The integrated circuit of claim 1, wherein the control information comprises a binary word.

12. The integrated circuit of claim 1, wherein the control information comprises an instruction.

13. A method for post-fabrication treatment of a phase locked loop, comprising:
    generating an output clock signal;
    comparing the output clock signal and input clock signal;
    generating a current dependent on the comparing;
    storing a voltage potential on a capacitor dependent on the current;
    selectively adjusting a leakage current of the capacitor using a leakage current offset circuit responsive to an adjustment circuit; and
    storing control information determined from the selectively adjusting.

14. The method of claim 13, wherein the selectively adjusting comprises:
    using the adjustment circuit to operatively control a gate of a transistor in the leakage current offset circuit.

15. The method of claim 13, wherein the selectively adjusting the leakage current comprises:
    controlling a first current flow between a first voltage potential and an output of the adjustment circuit; and
    controlling a second current flow between a second voltage potential and the output of the adjustment circuit.

16. The method of claim 13, wherein the storing the control information comprises using at least one selected from a group consisting of electrically programming a fuse, electrically programming a read only memory, electrically erasing a read only memory, programming a one time programmable memory, and programming a flash memory.

17. The method of claim 13, wherein the storing the control information comprises using at least one selected from a group consisting of laser programming a fuse and laser programming an anti-fuse.

18. The method of claim 13, further comprising:

reading the control information using a test processor unit; and operatively controlling the selectively adjusting of the leakage current with the test processor unit.

19. The method of claim 13, further comprising:

reading the control information using a tester; and controlling a test processor unit to adjust the leakage current using the adjustment circuit.

20. The method of claim 13, further comprising:

writing the control information using a tester.

21. The method of claim 13, wherein the control information represents an offset in the leakage current.

22. The method of claim 13, wherein the leakage current offset circuit comprises a transistor.

23. An integrated circuit, comprising:

means for generating a signal;

means for comparing the signal and a clock signal;

means for generating a current dependent on the means for comparing;

means for storing a charge dependent on the means for generating;

means for selectively adjusting a leakage current of the means for storing the charge; and means for storing control information dependent on the means for selectively adjusting.

* * * * *